(12) United States Patent
Ly et al.

(10) Patent No.: US 8,541,851 B2
(45) Date of Patent: Sep. 24, 2013

(54) MEMS PACKAGE

(76) Inventors: Toan K. Ly, Pasadena, CA (US); Jason P. Goodelle, McKees Rocks, PA (US)

( * ) Notice: Subject to any disclaimer, the term of this patent is extended or adjusted under 35 U.S.C. 154(b) by 289 days.

(21) Appl. No.: 12/678,930

(22) PCT Filed: Sep. 16, 2008

(86) PCT No.: PCT/US2008/010763
§ 371 (c)(1),
(2), (4) Date: Aug. 11, 2010

(87) PCT Pub. No.: WO2009/038692
PCT Pub. Date: Mar. 26, 2009

(65) Prior Publication Data
US 2010/0295139 A1 Nov. 25, 2010

Related U.S. Application Data

(60) Provisional application No. 60/960,186, filed on Sep. 19, 2007.

(51) Int. Cl.
*H01L 23/00* (2006.01)
(52) U.S. Cl.
USPC .... 257/416; 257/678; 257/692; 257/E23.002; 438/51
(58) Field of Classification Search
USPC ............... 257/416, 678, 692, 698, E23.002, 257/E29.324; 438/51–53
See application file for complete search history.

(56) References Cited

U.S. PATENT DOCUMENTS

| | | | | |
|---|---|---|---|---|
| 6,953,985 | B2 * | 10/2005 | Lin et al. | 257/659 |
| 7,183,622 | B2 * | 2/2007 | Heck et al. | 257/528 |
| 2007/0040231 | A1 * | 2/2007 | Harney et al. | 257/415 |
| 2007/0071268 | A1 | 3/2007 | Harney et al. | |
| 2007/0205492 | A1 | 9/2007 | Wang | |
| 2008/0150104 | A1 * | 6/2008 | Zimmerman et al. | 257/676 |
| 2008/0157301 | A1 * | 7/2008 | Ramakrishna et al. | 257/676 |

OTHER PUBLICATIONS

International Search Report for PCT/US2008/010763, dated Dec. 1, 2008.

\* cited by examiner

*Primary Examiner* — Zandra Smith
*Assistant Examiner* — Paul Patton
(74) *Attorney, Agent, or Firm* — Kenyon & Kenyon LLP

(57) ABSTRACT

An apparatus and method for manufacturing a micro-electrical mechanical system (MEMS) package comprising a first molded body having a first acoustic port, a second molded body connected to the first molded body, a leadframe at least partially integral with at least one of the first and second molded bodies, a die cavity provided on at least one of the first and second molded bodies and having a second acoustic port, a MEMS die provided on the die cavity, a channel connecting the first and second acoustic ports, the first molded body sealing at least a portion of the channel, and a lid attached to the second molded body and sealing at least a portion of the die cavity.

20 Claims, 11 Drawing Sheets

US 8,541,851 B2

MEMS PACKAGE

FIELD OF THE INVENTION

The present invention relates to an apparatus and method for manufacturing a MEMS package.

DISCUSSION OF THE RELATED ART

In high-performance acoustic MEMS devices, signals are transmitted via a continuous closed medium to the membrane at the die level. In the marketplace today, consumers demand ever thinner MEMS packages. Current MEMS packages are manufactured using multiple layers of FR 4 or similar material to create these packages. This is a slow and expensive process. Each layer must be separately manufactured with specific conductive patterns, and painstakingly machined to create the desired openings. Each layer is then laminated together to create the finished package. Using such a method, it takes between five and ten weeks to manufacture 500,000 MEMS packages.

FIG. 1 illustrates an example of a molded integrated circuit package 100. While molding technology has been adapted in the field of integrated circuits to create integrated circuit packages more efficiently, integrated circuit molding technology does not lend itself to acoustic MEMS packages. Unlike the integrated circuit package shown in FIG. 1, acoustic MEMS packages typically include at least one acoustic port and channel, which is enclosed within the package for sound isolation purposes. Creating an acoustic channel typically takes multiple steps and requires use of an insert to form the channel in the mold. In conventional moldings, any inserts 102 used to form cavities 104 in the circuit package 100 would remain inside, making removal of the insert 102 difficult or impossible. Accordingly, a need exists for an apparatus and method for forming an integrated molded acoustic MEMS package.

SUMMARY OF THE INVENTION

The present invention is directed to an apparatus and method for manufacturing a MEMS package.

Embodiments of the invention provide an apparatus and method for manufacturing a micro-electrical mechanical system (MEMS) package comprising a molded body, a printed circuit board at least partially integral with the molded body, a leadframe connected to the molded body, a die cavity provided on the leadframe and having a first acoustic port, a MEMS die provided on the die cavity, a lid connected to the leadframe and having a second acoustic port, the lid sealing at least a portion of the die cavity, and a channel connecting the first and second acoustic ports, the lid sealing at least a portion of the channel.

Another exemplary embodiment of the invention provides an apparatus and method for manufacturing a MEMS package comprising a molded body, a first printed circuit board at least partially integral with the molded body, a second printed circuit board connected to the molded body, a die cavity provided on at least one of the first and second printed circuit boards and having a first acoustic port, a MEMS die provided on the die cavity, a lid connected to at least one of the first and second printed circuit boards and having a second acoustic port, the lid sealing at least a portion of the die cavity, and a channel connecting the first and second acoustic ports, the lid sealing at least a portion of the channel.

Another exemplary embodiment of the invention provides an apparatus and method for manufacturing a MEMS package comprising a molded body having a first acoustic port, conductive traces applied to the molded body, a die cavity provided on the molded body and having a second acoustic port, a MEMS die provided on the die cavity, a channel connecting the first and second acoustic ports, a first lid attached to the molded body and sealing at least a portion of the channel, and a second lid attached to the molded body and sealing at least a portion of the die cavity.

Yet another exemplary embodiment of the invention provides an apparatus and method for manufacturing a MEMS package comprising a molded body having a first acoustic port, a leadframe at least partially integral with the molded body, a die cavity provided on the molded body and having a second acoustic port, a MEMS die provided on the die cavity, a channel connecting the first and second acoustic ports, a first lid attached to the molded body and sealing at least a portion of the channel, and a second lid attached to the molded body and sealing at least a portion of the die cavity.

Still another exemplary embodiment of the invention provides an apparatus and method for manufacturing a MEMS package comprising a first molded body having a first acoustic port, a second molded body connected to the first molded body, a leadframe at least partially integral with at least one of the first and second molded bodies, a die cavity provided on at least one of the first and second molded bodies and having a second acoustic port, a MEMS die provided on the die cavity, a channel connecting the first and second acoustic ports, the first molded body sealing at least a portion of the channel, and a lid attached to the second molded body and sealing at least a portion of the die cavity.

It should be understood that both the foregoing general description and the following detailed description are exemplary and explanatory, and intended to provide further explanation of the invention as claimed.

BRIEF DESCRIPTION OF THE DRAWINGS

The accompanying drawings, included to provide a further understanding of the invention, are incorporated in and constitute a part of this specification. They illustrate embodiments of the invention and, together with the description, serve to explain the principles of the invention. In the drawings.

DETAILED DESCRIPTION OF THE EMBODIMENTS

Figure 1:
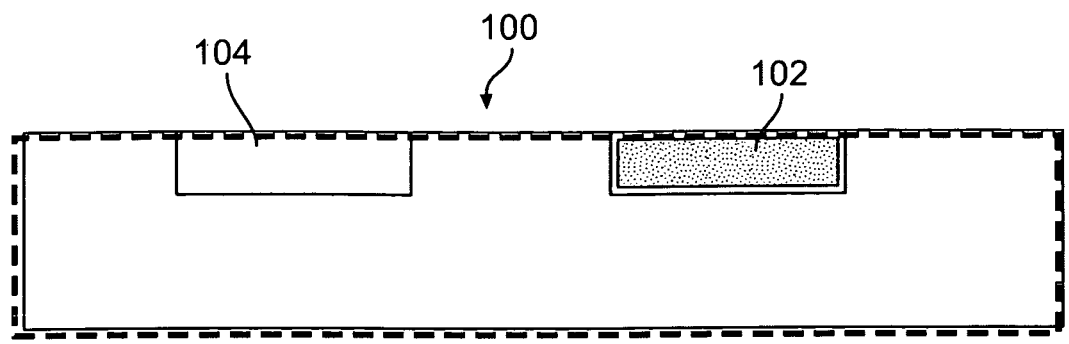
FIG. 1 illustrates an example of an injection molded integrated circuit.

The present invention provides a thin package profile relative to commercially available MEMS packages, reliably manufactured in high volume at low cost. The overall thickness of MEMS packages is dictated by a number of factors, including back volume/transducer interrelationships, material tolerances, and wiring/lead placement. For example, the back volume of a MEMS package cannot be appreciably reduced to thereby reduce the overall thickness of the package due to, at least, calibration of the transducer in the MEMS package.

Overall MEMS package thickness can be significantly reduced by (1) at least partially integrating the metal circuit frame into the mold of the MEMS package and/or (2) eliminating a prefabricated conductive frame altogether and replacing the frame with a thin-core PCB over-mold or plating a conductor in an appropriate shape directly onto a mold body. As used herein, the term "integral" means that at least a portion of one layer of a component extends at least partially into a layer of another component.

In accordance with the present invention, an apparatus (e.g., a package) and method for manufacturing a MEMS package are disclosed. In certain embodiments, the package can include a double-body or single-body design. In one exemplary embodiment of a double-body design, a leadframe is at least partially integral with a substrate (e.g., a molded body). In exemplary embodiments where the leadframe is at least partially integral with a substrate, the frame can be through-etched or partially-etched (e.g., half) to reduce the overall thickness of the MEMS package and frame combination, by virtue of the fact that both the substrate and frame are at least partially in the same layer. In another embodiment of a double-body design, a printed circuit board (PCB) is used in place of a frame, with the body over-molded onto the printed circuit board. This is called a thin-core PCB over-mold MEMS package. Replacing the frame with a printed circuit board further reduces the thickness of the MEMS package. In another embodiment of a double-body design, conductors can be on a mold surface. Such embodiments include plating of a conductor directly on the mold body. Because the leadframe does not need to be machined in such embodiments, these embodiments significantly reduce the overall thickness of the package by reducing the thickness of the leadframe to a minimum, with plating as thin as about 8 um being possible.

Reference will now be made in detail to the exemplary embodiments of the present invention, examples of which are illustrated in the accompanying drawings.

I. Frame Integral with a Molded Body

As discussed above, in certain embodiments, a frame, and in certain embodiments, an electrically conductive frame, is at least partially integrated with a substrate over-mold by either through etching or partial etching. This section describes exemplary embodiments of through-etched and partially-etched frames in accordance with the present invention.

A. Through-Etched Design

Through-etched frames are frames where at least a portion of the frame is etched or stamped completely through. For ease of reference, unless otherwise noted, "stamped" and "through-etched" are collectively referred to as "through-etched." The through-etched design includes a package substrate and method of fabrication. Exemplary embodiments of each are described hereafter.

1. Through-Etched Frame Integral with a Molded Body

Figure 2A:
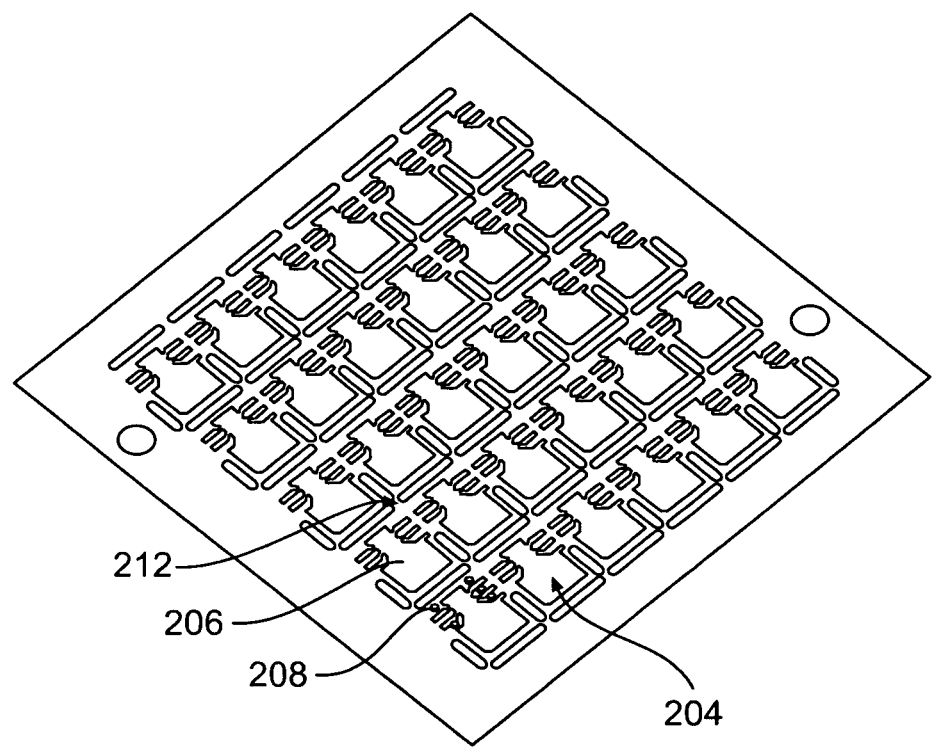
FIG. 2A illustrates an exemplary embodiment of a through-etched frame array in accordance with the present invention.

FIG. 2A illustrates an exemplary embodiment of an array 202 of through-etched frames 204 in accordance with the present invention. Each through-etched frame is approximately 150 um thick. The size and shape of the array 202 is exemplary only, and not limited to what is shown.

Forming frames and other parts in an array enables high-volume production of MEMS package components. High-volume production is defined as the production of millions of units per month, and applies to any embodiment described herein. In certain embodiments, approximately four million units or more can be produced per month.

In an array, individual components such as the through-etched frames 204 of the exemplary embodiment of the invention in FIG. 2A may be held together by connecting ribs 212 or supporting material (not shown) that may be removed after production. Other MEMS package components may also be manufactured in an array. Once the components are produced in an array, they may be singulated (i.e., separated from an array) using laser marking or other processes known to those skilled in the art. The components may be singulated before assembly, or manufactured as an array and then singulated. While the frame is shown as part of an array, in other exemplary embodiments, through-etched frames 204 may be manufactured individually.

Figure 2B:
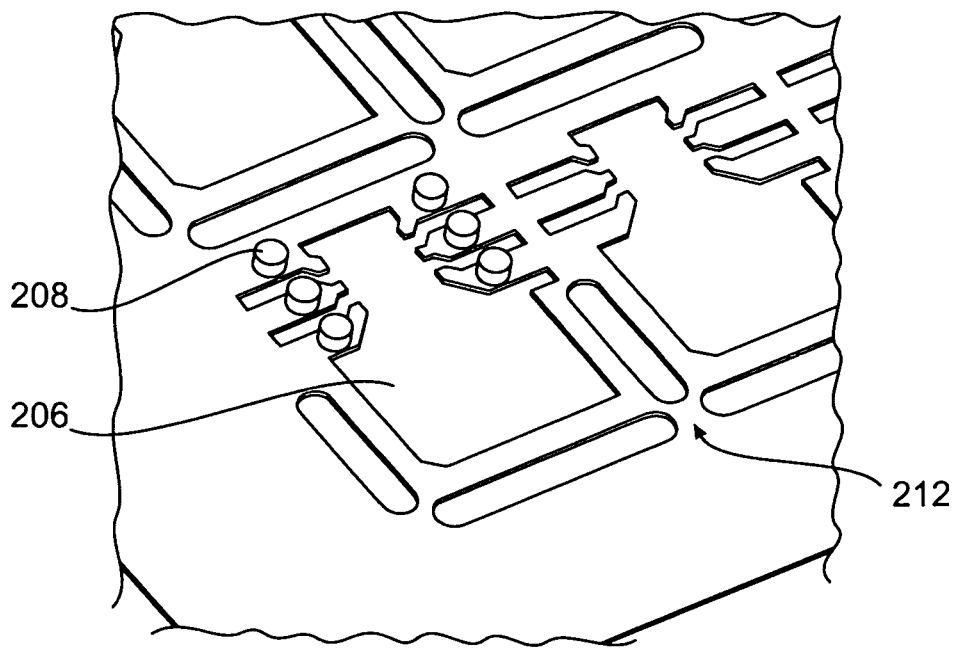
FIG. 2B illustrates a close-in view of the exemplary embodiment of a through-etched frame array in FIG. 2A.

In the through-etched frame 204 shown in FIG. 2A, the openings 206 may be etched through or, alternatively, they may be stamped through. In the exemplary embodiment shown, each through-etched frame 204 has interconnect posts 208 for electrically and/or mechanically connecting with other components. The number, shape, and size of the openings 206 and interconnect posts 208 are exemplary only, and not limited to what is shown. While the frames shown in the exemplary embodiment of FIGS. 2A and 2B are metal frames, other embodiments may have frames that are at least partially non-metallic. In other embodiments, the frame may be at least partially conductive, and may have one or more conducting layers (not shown). In frames with at least one conducting layer, such as the frame 204 of the exemplary embodiment shown in FIGS. 2A and 2B, connections among conducting layers may be through vias (not shown). Vias may be solid or at least partially hollow. They may be formed by any method known to those skilled in the art, including but not limited to use of conductive epoxy, metal inserts, conducting fillers, solder, or metal deposition. Vias are discussed in greater detail in the description of the exemplary embodiment of the invention shown in FIGS. 3A-3C.

FIG. 2B shows a close-in view of the interconnect posts 208 of FIG. 2A. The number, shape, and location of the interconnect posts 208 are exemplary only, and not limited to what is shown. In the embodiment of FIGS. 2A and 2B, the posts 208 are at least partially conductive, and may function as vias for connecting to a substrate (not shown). The interconnect posts 208 may be integrally molded with the frame 204. The interconnect posts 208 may be created through etching, metal deposition, solder, conductive paste, or other methods known to those skilled in the art. Manufacturing the posts 208 at the same time as the frame 204 eliminates the requirement for forming plated or solid conductive vias (not shown) in a molded body substrate, since the interconnect posts 208 may be used for conducting. Again, vias are discussed in more detail in the description of the embodiment of the invention shown in FIGS. 3A-3C.

2. Through-Etched Frame Molded Package

Figure 3A:
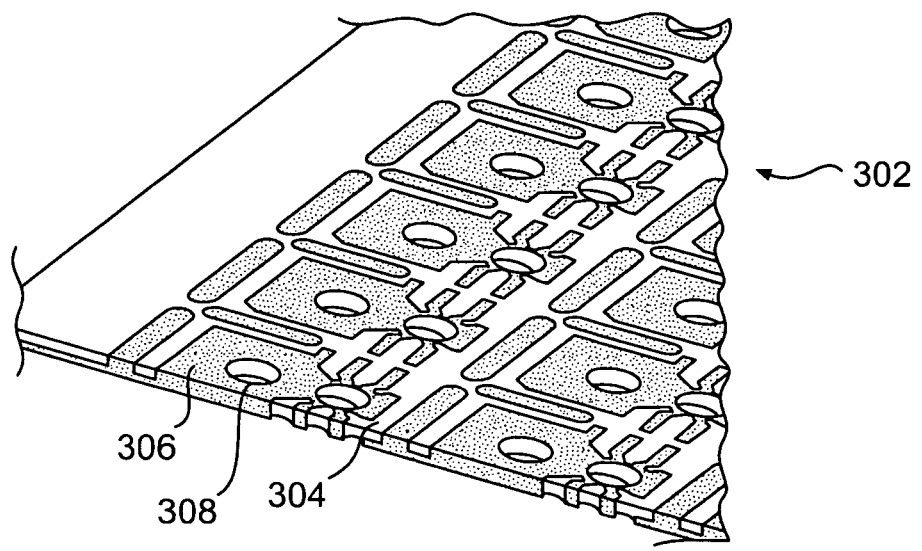
FIG. 3A illustrates an exemplary embodiment of a through-etched frame molded body array in accordance with the present invention.
Figure 3B:
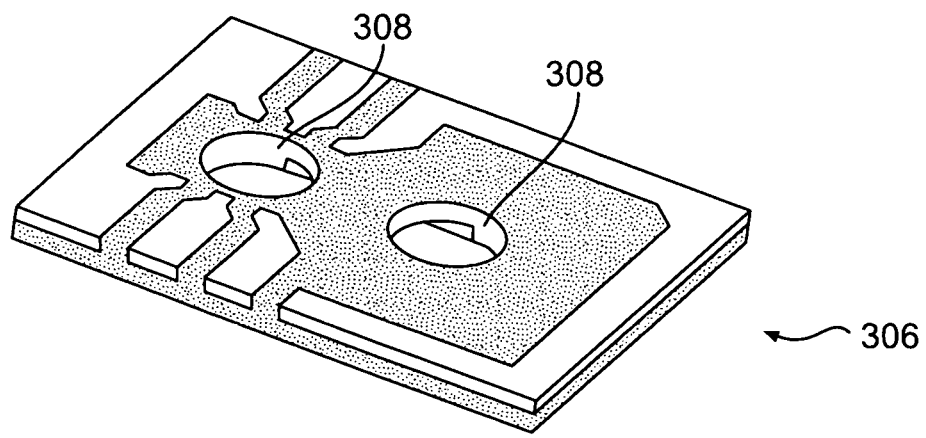
FIG. 3B illustrates a top view of an exemplary embodiment of a through-etched frame molded body in accordance with the present invention.
Figure 3C:
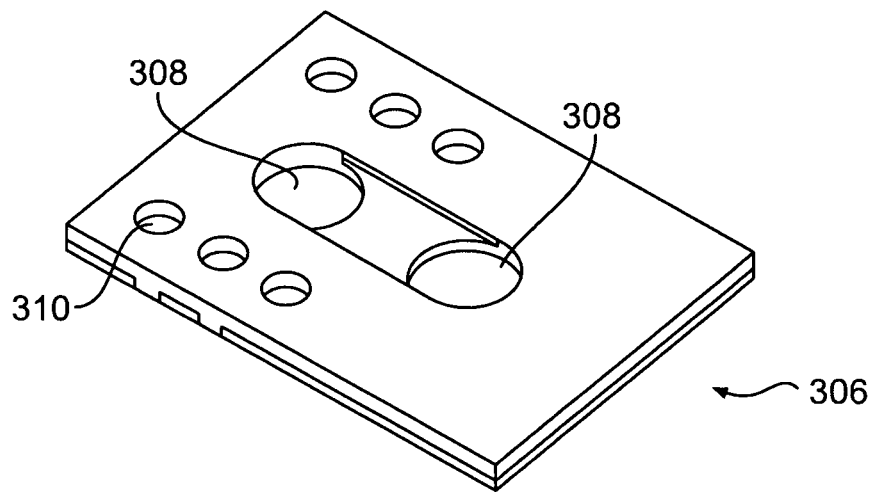
FIG. 3C illustrates a bottom view of an exemplary embodiment of a through-etched frame molded body in accordance with the present invention.

FIGS. 3A-3C show an exemplary embodiment of the invention with a through-etched frame 304 formed as an integral part of the molded body 306 of a MEMS package. Molding is preferable to the related art method of layering FR-4 substrates because it enables better control of dimensional tolerances such as, for example, acoustic channel dimensional tolerances. Molding the molded body 306 integrally with the through-etched frame 304 also simplifies the production process. In contrast with conventional molding technology, where removal of an insert (not shown) used to form an acoustic channel is difficult or impossible, molding the molded body 306 integrally with the frame enables easy removal of inserts.

FIG. 3A shows an array 302 of through-etched frames 304 after they have been at least partially integrally molded with a molded body 306. Using conventional technology, the frame would have been stacked onto a substrate. In contrast to conventional technology, once the through-etched frames 304 of the invention are formed, they are placed into a mold of a desired shape (not shown), and molding compound (not shown) is added to the mold to create a substrate that is at least partially integrally molded with the through-etched frame 304. The molding compound may be comprised of one or more of a liquid crystal polymer (LCP), thermoplastic material, or other molding compound known to those skilled in the art. Mold inserts (not shown) may be used to create cavities 308 in the molded body by excluding molding material from portions of the mold. Those inserts are removed after molding, leaving cavities 308 within the molded body 306 in place of the inserts. Though the exemplary embodiment shows formation of a molded package array 302, in other embodiments of the invention the molded bodies 306 may be formed individually.

FIG. 3B is a top view of a molded body 306 having an integrally-molded through-etched frame 304. In the exemplary embodiment shown, the through-etched frame 304 is at least partially integrally molded with the molded body 306. The large openings 308 in the molded body 306 may be used to form acoustic ports (not shown). Acoustic ports are discussed in detail further in the specification.

FIG. 3C is a bottom view of a singulated molded body 306 with a through-etched frame 304. The small openings 310 in the molded body may be used to form vias (not shown). Vias may be solid or hollow. Hollow vias may be made using inserts (not shown) during the molding process to create openings in the molded body. For example, in embodiments of the invention having a frame with conductive posts (not shown), vias may be left hollow, with the posts (e.g., post 208) filling the space. This eliminates the step of filling in the vias, simplifying MEMS package manufacture. In other embodiments, vias may instead be filled in with conductive solder or epoxy, conductive paste, or other material (not shown), or by other methods known to those skilled in the art. In an exemplary embodiment of the invention such as the one shown in FIGS. 3A-3C, vias (not shown) may be formed during molding, with multiple vias formed in multiple sites in a single step. In contrast, vias in non-integrally formed substrates are often formed in multiple steps by drilling through the body after the body is formed.

B. Partially-Etched Design

Partially-etched frames are frames where at least a portion of the frame is partially etched (e.g., half), but is not completely etched or stamped through. The partially-etched design includes a package substrate and method of fabrication. Each is described hereafter.

1. Partially-Etched Frame

Figure 4A:
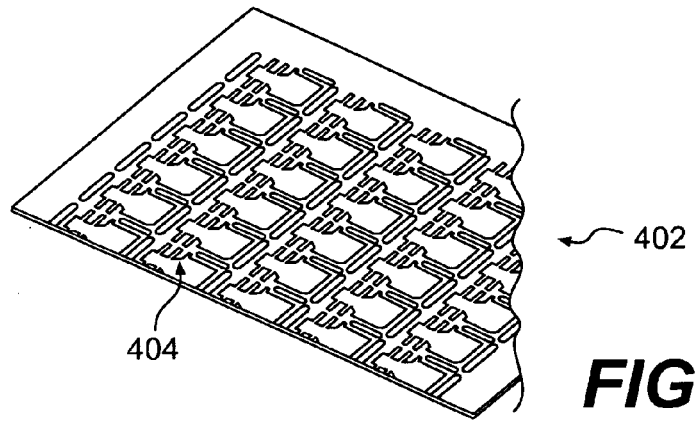
FIG. 4A illustrates an exemplary embodiment of a partially-etched frame in accordance with the present invention.

FIG. 4A shows an exemplary embodiment of an array 402 of partially-etched frames 404. The partially-etched frames 404 shown are 50 um+/−25 um thick. In contrast with the through-etched frame described above, a partially-etched frame 404 is not etched or stamped completely through. Instead, the frame is only partially etched, ground, or ablated in order to create one or more die cavities (not shown) and circuitry patterns 406 on the frame 404. For ease of reference, unless otherwise noted "partially-etched", "ground", and "ablated" are collectively referred to as "partially-etched." The number, shape, and size of the etchings are exemplary only, and not limited to what is shown. In the embodiment shown the partially-etched frame 404 is part of an array 402, but in other embodiments it may be individually manufactured.

While the frames shown in the exemplary embodiment of FIG. 4A are metal, other embodiments may have frames that are at least partially non-metallic. In other embodiments, the frame may be at least partially conductive, and may have one or more conducting layers (not shown). The partially-etched frame 404 may optionally have one or more conducting layers (not shown). Connections among conducting layers may be through solid or hollow vias (not shown). Vias can be formed by any method known to those skilled in the art, including but not limited to use of conductive epoxy, metal insert, conducting fillers, or metal deposition. Vias are discussed in greater detail in the description of the embodiment of the invention shown in FIGS. 3A-3C.

2. Partially-Etched Frame Molded Package

FIGS. 4B-4E show an exemplary embodiment of a process used to create an array with the molded body 408 integral with a partially-etched frame 404. The embodiments shown in FIGS. 4B-4E are exemplary only, and not limited to what is shown. For example, while shown as part of an array in FIGS. 4B-4E, in other exemplary embodiments the molded body 408 and frame 404 may be manufactured individually.

Figure 4B:
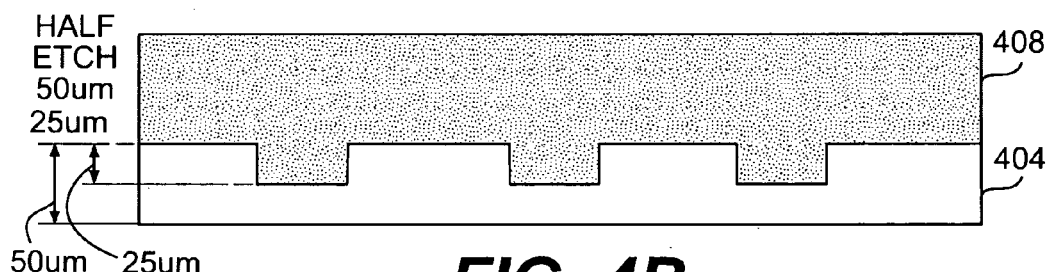
FIG. 4B illustrates a cutaway view of an exemplary embodiment of a partially-etched frame in accordance with the present invention.
Figure 4C:
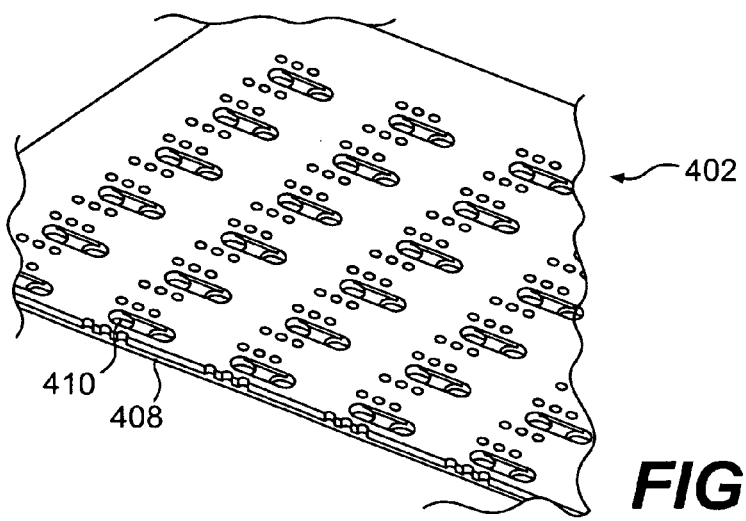
FIG. 4C illustrates a bottom view of an exemplary embodiment of a partially-etched frame in accordance with the present invention.

In the exemplary embodiment shown in FIG. 4B, once a frame is formed, a molded body 408 is integrally molded with the frame. The frame shapes and patterns are exemplary only, and not limited to what is shown. Although the embodiment shown has a partially-etched frame 404, other embodiments may have a molded body 408 at least partially integrally molded with a through-etched frame (not shown). The molding forming the molded body 408 may be one or more of a liquid crystal polymer, filled epoxy, filled nylon, poly ether ether ketones (PEEK), or other molding material known to those skilled in the art. FIG. 4C illustrates a bottom view of a partially-etched frame array 402 shown in FIG. 4B. As shown in FIG. 4C, inserts (not shown) may be used to form openings 410 in the molded body 408. For example, the openings 410 may be shaped to house acoustic channels, vias, die cavities, and other MEMS package components. The size, shape, and location of the openings are exemplary only, and not limited to what is shown.

Figure 4D:
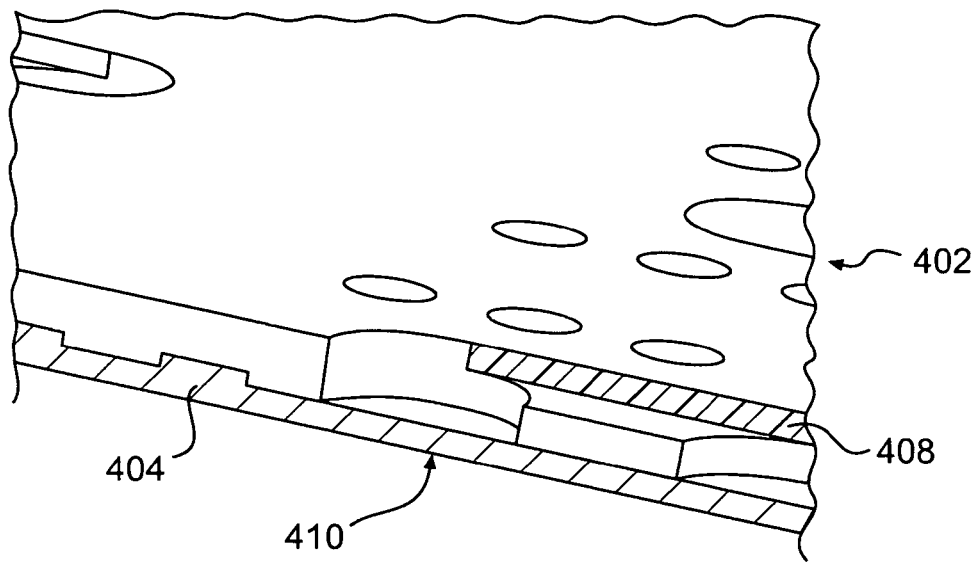
FIG. 4D illustrates a close-in view of an exemplary embodiment of an integrally molded partially-etched frame in accordance with the present invention.
Figure 4E:
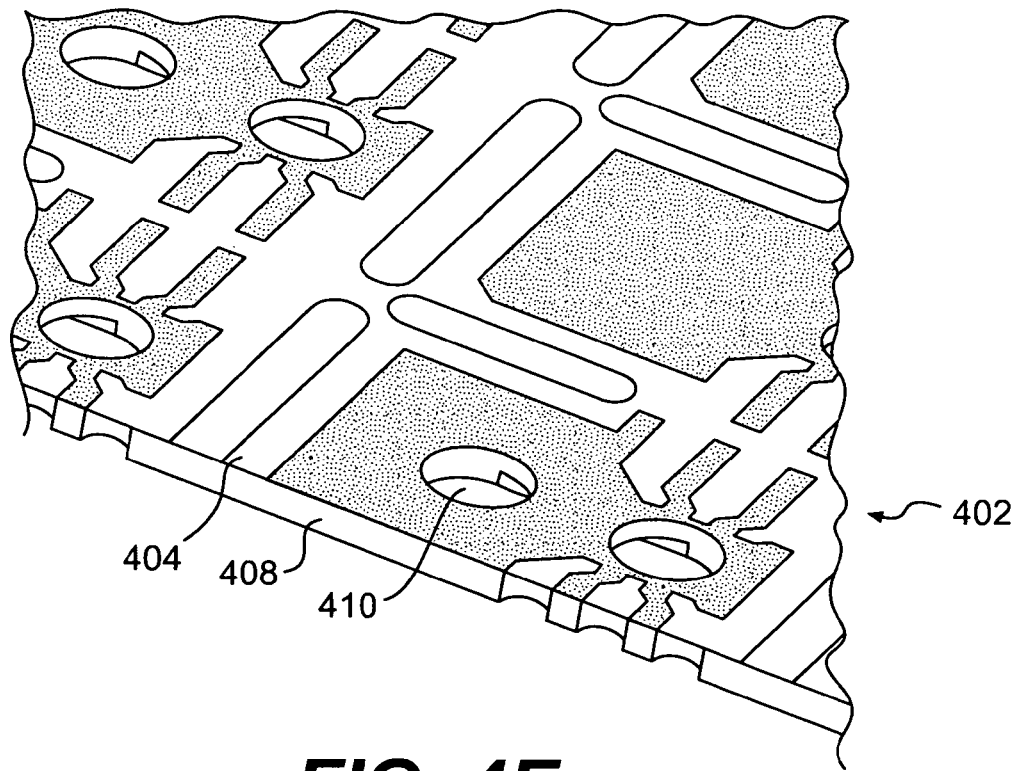
FIG. 4E illustrates a top view of a molded body array with a partially-etched frame in accordance with the present invention.

FIG. 4D illustrates a close-in view of an exemplary embodiment of a molded body 408 with an integrally-molded partially-etched leadframe 404 in accordance with the present invention, prior to removing the metal covering the openings 410 in the molded body 408. As this embodiment shows, a partially-etched frame 404 allows for a thinner MEMS package (not shown), but leaves a portion of the frame covering the molded body openings 410. Those portions of the frame may be etched, ground, or ablated to form the desired openings. FIG. 4E illustrates top view of an exemplary embodiment of a molded body array 402 with a partially-etched leadframe 404 in accordance with the present invention after metal covering the openings in the molded body 408 is removed. This step may be omitted in a molded body having a through-etched or stamped leadframe (not shown).

II. Conductor on Substrate

This section describes exemplary embodiments of the invention having a thin-core PCB over-mold and/or a plated molded body. Exemplary embodiments of each are discussed below.

A. Thin-Core PCB Over-Mold

Figure 5A:
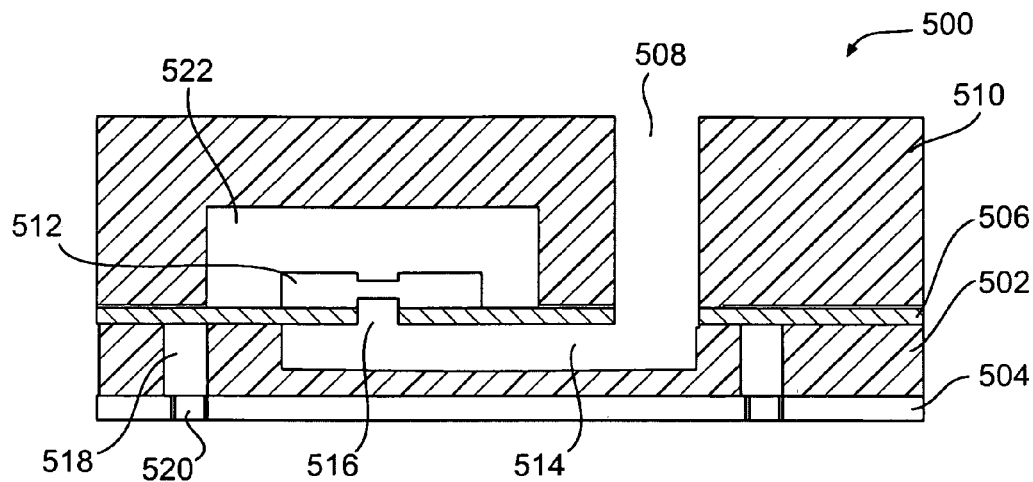
FIG. 5A illustrates a double-body MEMS package with a frame and thin PCB over-mold in accordance with the present invention.
Figure 5B:
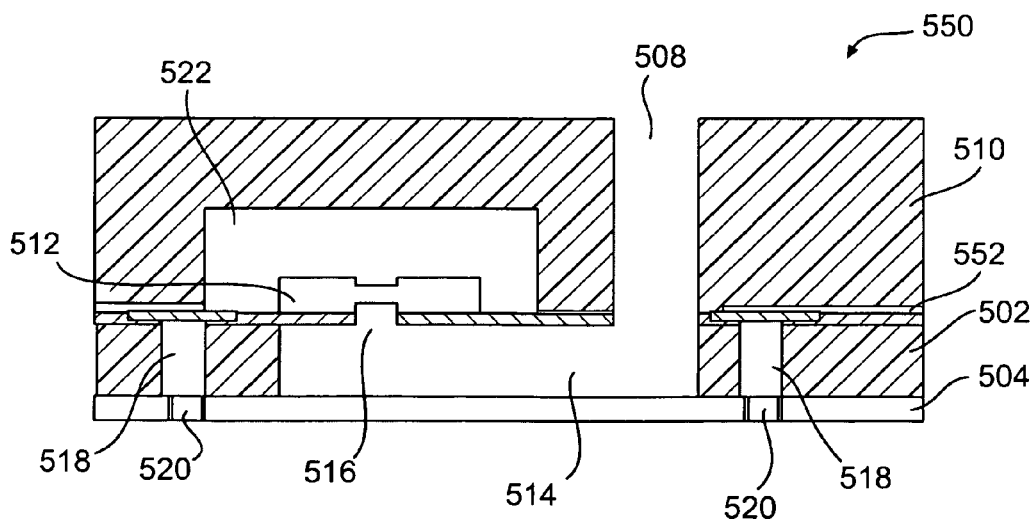
FIG. 5B illustrates a double-body MEMS package with an upper PCB and lower thin PCB over-mold in accordance with the present invention.

FIGS. 5A and 5B show exemplary embodiments of double-body MEMS packages 500/550 with the molded body 502 at least partially over-molded onto a printed circuit board 504. FIG. 5A shows an exemplary embodiment of the present invention having a double body with a frame 506 and thin PCB over-mold 504. In the exemplary embodiment shown in FIG. 5A, sound enters the MEMS package 500 through a sound source acoustic port 508 in the top of the lid 510 and travels from the lid 510 into the molded body 502 until it reaches the MEMS die 512. The location of the sound source acoustic port 508 is exemplary only, and not limited to what is shown. For example, the sound source acoustic port 508 may be relocated by repositioning inserts used to form the sound source acoustic port 508 during molding. The sound source acoustic port 508 connects to an acoustic channel 514, which forms a sealed continuous path ending at a die site acoustic port 516. The acoustic channel 514 propagates sound to a membrane (not shown) at MEMS package die 512. The acoustic channel 514 may be formed by using one or more inserts (not shown) during the molding process, by drilling into the body the MEMS package 500, or by other methods known to those skilled in the art.

The printed circuit board 504 forms the bottom of the MEMS package 500, further reducing package thickness. In embodiments where the sound source acoustic port 508 in on the bottom of the MEMS package (not shown), the printed circuit board 504 seals the acoustic channel 514 to form the completed sound transmission route from the sound source acoustic port 508 to the die site acoustic port 516. The molded body 502 is over-molded onto the top of the printed circuit board 504. Vias 518 in the molded body 502 connect to printed circuit board traces 520. The vias 518 may be solid or hollow. The top of the molded body 502 then connects to a frame 506. Any inserts (not shown) used during molding are removed, and the top of the molded body 502 is connected to the frame 506. The frame 506 may be partially or through etched. The molded body 502 may connect to the frame 506 by welding to vias 518 in the molded body 502, by solder or conductive paste, or other methods known to those skilled in the art. In embodiments with hollow vias 518, conductive posts (not shown) in the frame 506 may insert into the vias 518 to connect electrically with the printed circuit board 504. The top of the frame 506 attaches to a lid 510. A description of the lid 510 and ways of attaching it to the frame is provided in the description of the embodiments shown in FIGS. 10A and 10B.

In the embodiment shown in FIG. 5A, the frame 506 functions as a carrier for the MEMS die 512. The MEMS die 512 is not limited to what is shown, and can be any die known to those skilled in the art. The MEMS die 512 may be placed in a die cavity 522. The die 512 may attach to the frame 506 in either a flip chip or a bonding wire configuration. The die 512 in the embodiment shown in FIG. 5A attaches in a flip chip configuration. In other exemplary embodiments, the die 512 may attach in a bonding wire configuration. A description of both attachment configurations is provided in the description of the embodiments shown in FIGS. 10A and 10B.

FIG. 5B shows an exemplary embodiment of a double-body MEMS package 550 with upper and lower printed circuit boards 504/552. The upper printed circuit board 552 takes the place of a frame. Replacing the frame with a printed circuit board allows for an even thinner MEMS package, and greater interconnection flexibility. The molded body 502 may be molded either to the upper or lower printed circuit board 504/552, but not both. In the exemplary embodiment shown in FIG. 5B, the molded body 502 is over-molded to the lower printed circuit board 504. In other embodiments, the molded body 502 may be molded to the upper printed circuit board 552. In the embodiment shown, vias 518 in the molded body 502 connect to traces 520 on the lower printed circuit board 504. The vias 518 may be solid or hollow. Solid vias 518 may be formed with a conductive solder or epoxy, conductive paste, or a polymer filled with conductive material (not shown). The top of the molded body 502 connects to the upper printed circuit board 552. In the embodiment shown in FIG. 5B, the upper printed circuit board 552 attaches to the molded body 502. Any inserts (not shown) used to form the molded body 502 are removed prior to attaching the upper printed circuit board 552 to the molded body 502. The molded body 502 may attach to the upper printed circuit board 552 using any of the methods and materials disclosed in the description of the attachment of the upper and lower molded bodies shown in FIGS. 10A and 10B.

In the embodiment shown in FIG. 5B, an adhesive layer 554 attaches the upper printed circuit board 552 to a lid 510. A description of the lid 510 and ways of attaching it are provided in the description of the embodiments shown in FIGS. 10A and 10B. In the embodiment shown in FIG. 5B, the upper printed circuit board 552 functions as a carrier for the MEMS die 512. The MEMS die 512 may attach to the upper printed circuit board 552 in either a flip chip or a bonding wire configuration, and is not limited to what is shown. In the exemplary embodiment of FIG. 5B the die 512 attaches in a flip chip configuration. In other exemplary embodiments, the die 512 may attach in a bonding wire configuration. A description of both attachment configurations is provided in the description of the embodiment shown in FIGS. 10A and 10B.

B. Plated Molded Body

In embodiments of the invention having a plated molded body, conductive plating may be used in place of a frame. The plated design includes a molded body and method of fabrication. Both are described below.

1. Design

In a plated MEMS Sensors Molded Package, the molded body is molded without a frame, and conductive traces are applied directly to the molded body. The traces may be plated onto the molded body, or applied using other methods known to those skilled in the art. This is called a plated design. In a plated design, the thickness of the leadframe (150 um for through-etched frames and 50 um+/−25 um for partially-etched frames) is replaced by metal plating as thin as 8 um or less. This allows even thinner MEMS packages (e.g., less than 1.3 mm). Examples of plating techniques are described in the article *Laser Supported Activation and Additive Metallization of Thermoplastics for 3D-MIDS* by M. Huske et al., which is hereby incorporated by reference in its entirety.

2. Fabrication

Figure 6A:
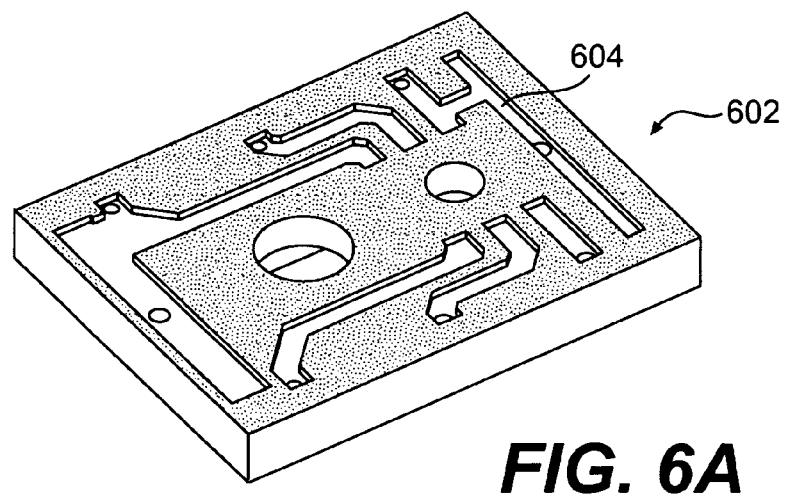
FIG. 6A illustrates an exemplary embodiment of a plated molded body in accordance with the present invention.

FIG. 6A shows an exemplary embodiment of a plated molded body 602. Though shown as a single molded body 602, in other embodiments the molded body 602 may be manufactured as part of an array (not shown). In the embodiment shown, rather than placing a frame into a mold and then adding molding compound, molding compound (not shown) is added to a mold without a frame. In this exemplary embodiment, plated conductors (also known as conductive traces 606) are added after molding the molded body 602. The molded body 602 may be formed with grooves 604 and vias 608, which may be used for conductor routing. FIG. 6A shows an example of a molded body 602 with grooves 604 prior to adding conductors (not shown). In the embodiment shown the grooves 604 define the location of conductor routings, while in other embodiments the grooves 604 may be omitted. The routings may conduct power or signals, or act as a grounding path. The grooves 604 may be formed during or after molding. The grooves 604 may be included in the mold tooling, or may be formed using other methods known to those skilled in the art. Though not shown, grooves may also be formed on other surfaces of the molded body, including the sides and the back.

Figure 6B:
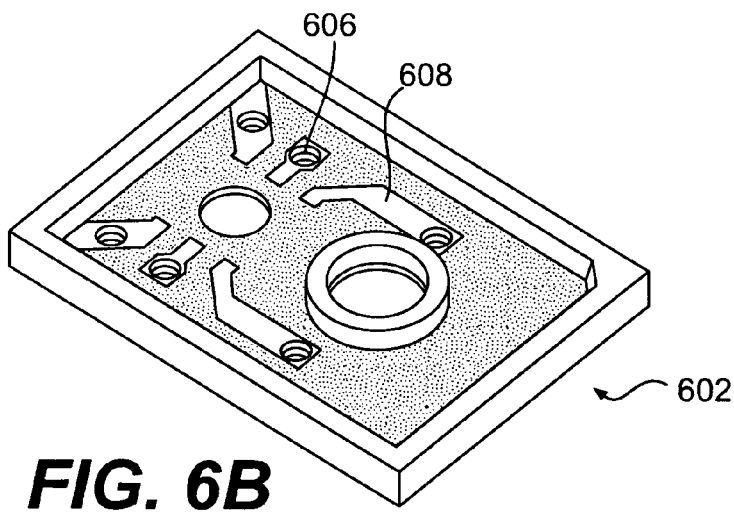
FIG. 6B illustrates a top view of an exemplary embodiment of a plated molded body with plated conductive traces and vias in accordance with the present invention.
Figure 6C:
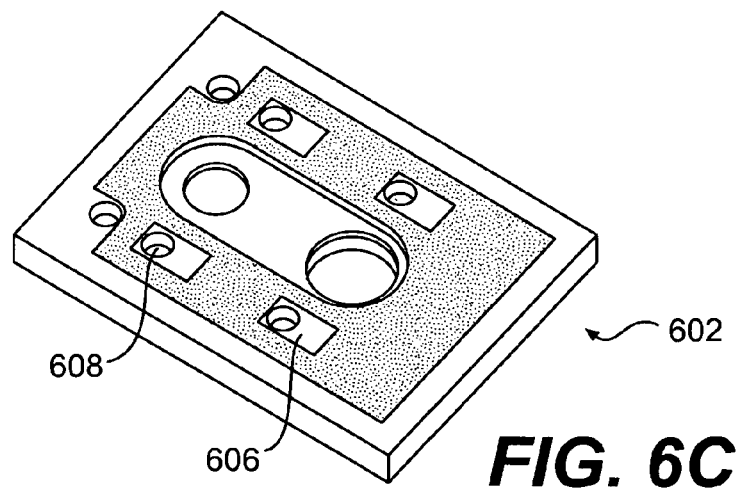
FIG. 6C illustrates a bottom view of an exemplary embodiment of a plated molded body with plated conductive traces and vias in accordance with the present invention.

FIGS. 6B and 6C show top and bottom views of the exemplary embodiment of the molded body 602 of FIG. 6A, with conductive traces 606 plated on the grooves 604 and vias 608. In other embodiments, the traces 606 may be plated instead of screen or stencil printed. In the embodiment shown, the conducting traces 606 and plated vias 608 may be formed by subtraction (etching away) or addition (plating or vacuum metallization). The conductive traces 606 may be conductive epoxy, metal, conductive paste, or other materials known to those skilled in the art. The conductive epoxy may be screen printed into the grooves 604 and vias 608. Plating may also be accomplished using removable masking or seed layers (not shown) or other methods known to those skilled in the art. The conductive epoxy may be screen or stencil printed using techniques known to those skilled in art. Screen printing is described at page 483 and plating on page 714 of the book entitled "Microelectronics Packaging Handbook" edited by R. R. Tummala and E. J. Rymaszewski, Van Nostrand Reinhold, N.Y., 1989, which is hereby incorporated by reference in its entirety. The number, shape, and size of the traces shown in FIGS. 6B and 6C are exemplary only, and not limited to what is shown.

III. Single-Body and Double-Body Embodiments of MEMS Packages with Integral Leadframe and/or Plated Molded Bodies The exemplary integral leadframe and plated molded bodies described above may be used to form embodiments of single-body and double-body MEMS packages according to the present invention. Exemplary embodiments of single and double-body MEMS packages are described below. Though not described or shown, other packages with more than two molded bodies may be used without departing from the scope of the invention.

A. Single-Body Design-Leadframe Over-Mold

FIGS. 7A-E illustrate an exemplary embodiment of a single-body leadframe MEMS package 700 assembled in accordance with the present invention. Only the molded body, frame, MEMS die, and top and bottom lids are shown. Other items that would typically be part of an acoustic MEMS package are omitted for clarity.

Figure 7B:
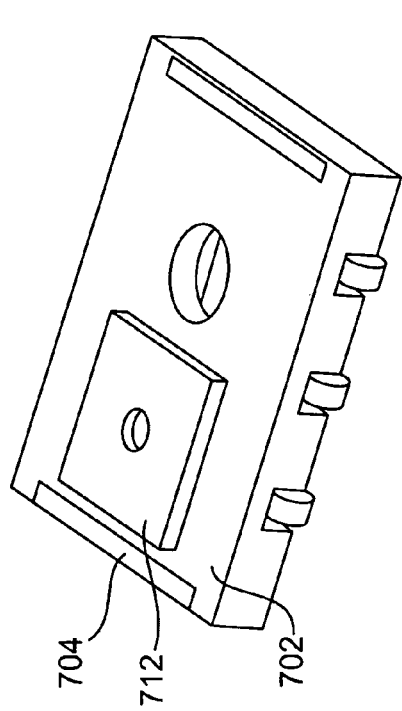
FIGS. 7A-7D illustrate an exemplary embodiment of a single-body leadframe MEMS package assembled in accordance with the present invention.
Figure 7D:
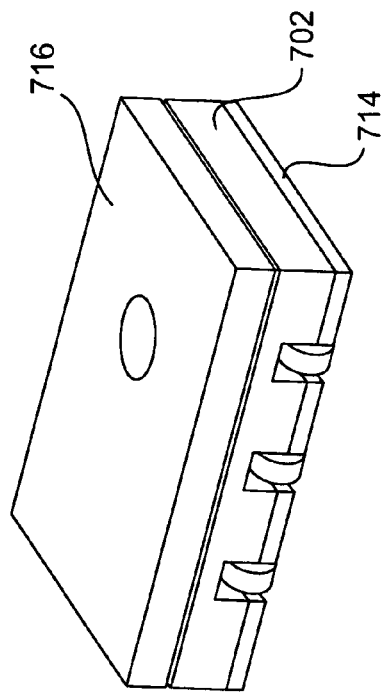
Figure 7A:
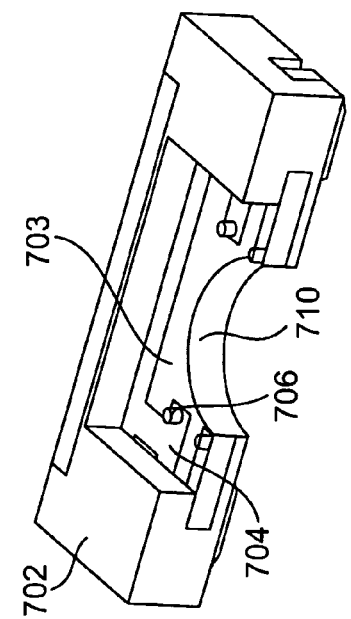
Figure 7C:
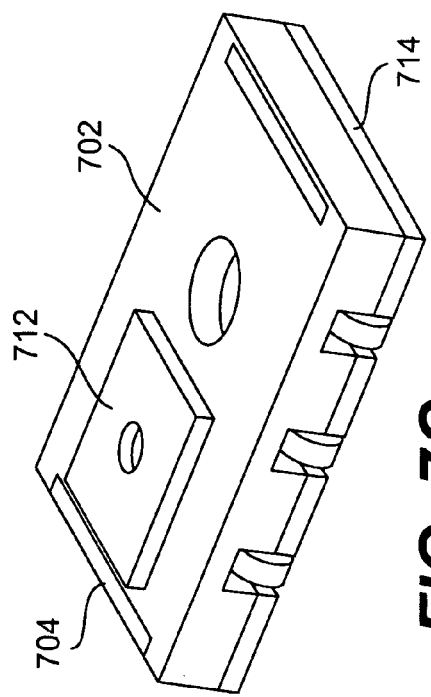
Figure 7E:
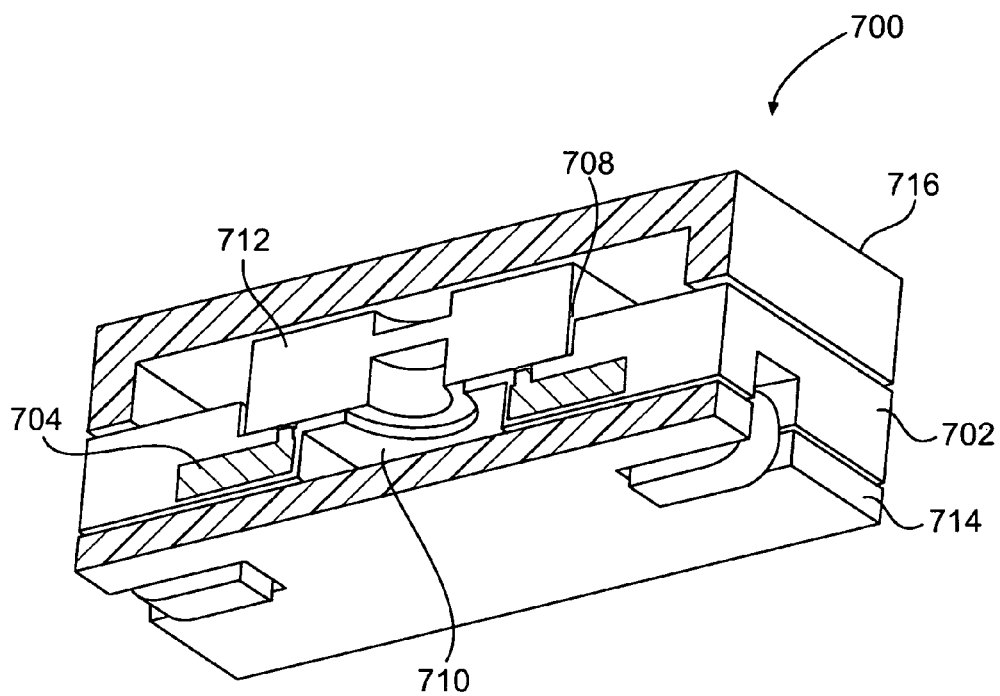
FIG. 7E illustrates a cutaway view of an exemplary embodiment of a single-body molded leadframe assembly in accordance with the present invention.

As shown in FIG. 7A, assembly starts with the molded body 702. In the exemplary embodiment shown, the molded body 702 has a leadframe 704 with conductive posts 706, and a die cavity 708 for placing a MEMS die (not shown). The die cavity 708 has a die site acoustic port 710 for sound to enter the MEMS die 712. The leadframe 702 may be through or partially etched. In the embodiment shown in FIG. 7B, the MEMS die 712 is placed in the die cavity 708 (not shown). A lower lid 714 attaches to the bottom of molded body 702, as shown in FIG. 7C and, as shown in FIG. 7D, an upper lid 716 attaches to the top of the molded body 702. FIG. 7E shows a cutaway view of the completed single-body molded MEMS package 700.

Figure 8:
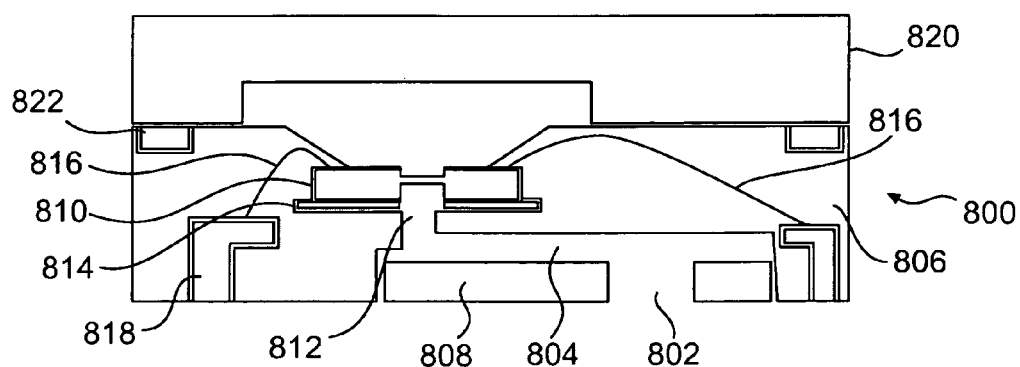
FIG. 8 illustrates an exemplary embodiment of a single-body MEMS package with a bottom acoustic port in accordance with the present invention.

FIG. 8 shows an exemplary embodiment of the present invention having a singe-body MEMS package 800 with a sound source acoustic port 802 on the bottom of the package. In the single-body MEMS package 800 shown, the lower lid 804 and molded body 806 form the acoustic channel 808, and interconnections are made using the frame (not shown). The frame may be through or partially etched. In other embodiments, leads may instead be plated on the molded body 806. In the embodiment shown, sound enters the MEMS package 800 through a sound source acoustic port 802 in the bottom of the molded body 806. The location of the sound source acoustic port 802 is exemplary only, and not limited to what is shown. After passing through the sound source acoustic port 802, sound enters the acoustic channel 808. The acoustic channel 808 forms a sealed continuous path ending at a die site acoustic port 812. The acoustic channel 808 propagates sound to a membrane (not shown) at a die 810 in the MEMS package 800.

The lower lid 804 connects to the molded body 806 and seals the acoustic channel 808 to form the completed sound transmission route from the sound source acoustic port 802 to the die site acoustic port 812. The size and location of the lower lid 804 are exemplary only, and not limited to what is shown. The lower lid 804 may be conductive. In other embodiments the lower lid 804 may be machined instead of molded, or formed through a combination of molding and machining, and is not limited to what is shown. Machining can be done mechanically, using a laser, or by other methods known to those skilled in the art. The lower lid 804 may be formed using one or more of a liquid crystal polymer, mold compound, filled epoxy, filled nylon, or poly ether ketone (PEEK). It may also be plated plastic, or stamped metal. In the exemplary embodiment shown, the lower lid 804 glues to the molded body 806. In other embodiments, the lower lid 804 may connect to the molded body 806 using plastic joining techniques, by an adhesive layer (not shown), by an epoxy (not shown), be snapped in place using tabs with corresponding receivers (not shown), or by other methods known to those skilled in the art.

In the exemplary embodiment of FIG. 8, the molded body 806 is at least partially integrally molded with a frame (not shown). The molded body 806 functions as a carrier for the MEMS die 810. The MEMS die 810 is not limited to what is shown, and can be any die known to those skilled in the art. The MEMS die 810 may be placed in the die cavity 814 before molding the molded body to the frame (over-molding) or it may attach to the frame after molding the molded body 806 with the frame (pre-molding). The die 810 may attach to the frame (not shown) in either a flip chip or a bonding wire configuration. In embodiment shown in FIG. 8 the MEMS die 810 attaches to a printed circuit board (not shown) in a bonding wire configuration using one or more bonding wires 816 connected to one or more conductive traces 818. The connection to the MEMS die 810 is exemplary only, and not limited to what is shown. In other embodiments the bonding wires 816 may connect to one or more vias (not shown), plated through holes (not shown), or other connections known to those skilled in the art.

The molded body 806 connects to an upper lid 820 which seals at least a portion of the die cavity 814. The upper lid 820 may be formed by molding or machining, and is not limited to what is shown. It may be formed using one or more of a liquid crystal polymer, mold compound, filled epoxy, filled nylon, or poly ether ketone (PEEK). The upper lid 820 may also be plated plastic, or stamped metal. In certain embodiments, the upper lid 820 may be conductive and form a Faraday Cage by connecting to a grounding connection, such as a grounding ring 822. In the exemplary embodiment shown, the upper lid 820 is comprised of molded liquid crystal polymer (LCP), and glues to the MEMS package 800. In other embodiments, an adhesive layer (not shown) may connect the upper lid 820 to the molded body 806. In still other embodiments, attachment can be by any means known to those skilled in the art.

B. Double-Body Design-Leadframe Over-mold

FIGS. 9A-10B illustrate exemplary embodiments of double-body MEMS packages. A double-body MEMS package has two molded bodies instead of one. One or both of the molded bodies may have an integral leadframe, or a plated molded package. While the double-body MEMS packages have many similarities to the single-body MEMS packages, the double-body embodiments may have a conductive bottom lid for electrically connecting the upper and lower molded bodies.

Figure 9A:
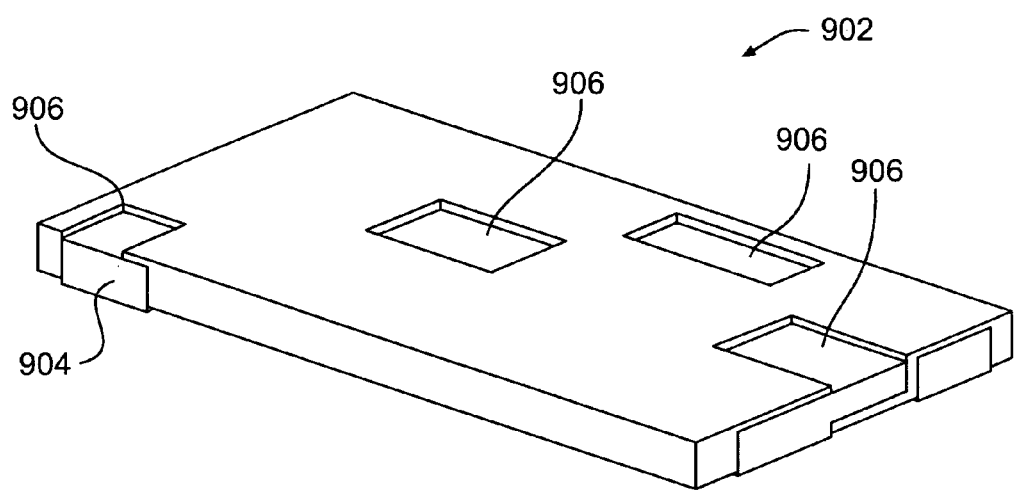
FIG. 9A illustrates a top view of an exemplary embodiment of a double-body bottom lid in accordance with the present invention.

FIG. 9A shows a top view of an exemplary embodiment of a bottom lid 902 with portions of the exposed frame 904 etched, molded, and patterned by an organic layer (not shown). An organic layer is a non-conductive epoxy or solder mask compound. Organic layers may be molded and/or patterned using an epoxy or solder mask screen printing. In the exemplary embodiment shown, the bottom lid conducting layers (not shown) are manufactured by patterning the frame 904.

The exposed portions of the conducting layers 904 are called pads 906. Pads 906 connecting to the molded body (not shown) are formed by stamping, etching, or ablating a pattern onto the frame 904. In the embodiment shown, the pads 906 are copper, but are not limited to what is shown and may be any conductive material. In the exemplary embodiment shown in FIG. 9A, the pads 906 on the top of the bottom lid 902 electrically connect to the molded body. In the embodiment shown, the pads 906 are soldered to connections (not shown) on the molded body. The solder may be conductive. In other embodiments, the pads 906 may connect to the molded body using tape, conductive paste, or other materials known to those skilled in the art. The pad layout is exemplary only, and not limited to what is shown. Other pad layouts may be created simply by changing the plating pattern. Vias (not shown) in the upper and lower molded bodies (not shown) can be used with multitude pad layout patterns, allowing for much greater design flexibility.

Figure 9B:
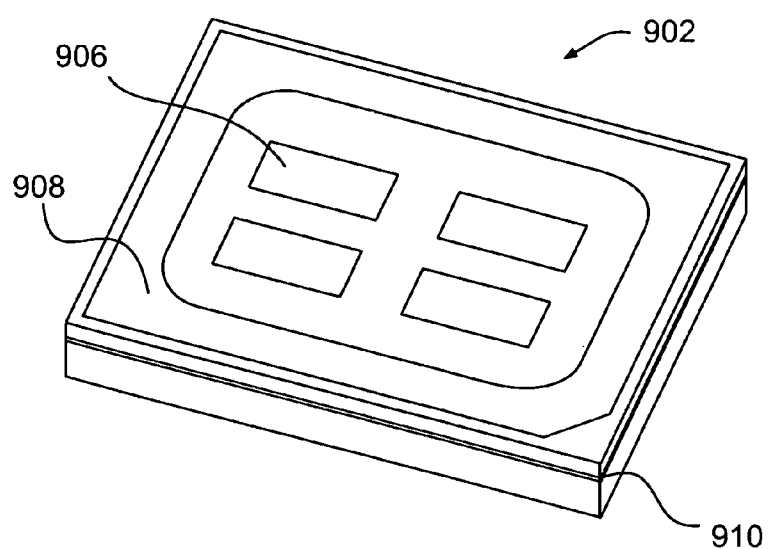
FIG. 9B illustrates a bottom view of an exemplary embodiment of a double-body bottom lid in accordance with the present invention.

FIG. 9B shows a bottom view of an exemplary pad layout connecting the bottom lid 902 to a printed circuit board (not shown). The top of the bottom lid 902 forms the bottom surface of the acoustic channel (not shown) and connects to a molded body (not shown) by a lower adhesive layer (not shown). In other exemplary embodiments, the bottom lid 902 may connect to a molded body (not shown) using an epoxy, solder, tape, or other bonding material know to those skilled in the art.

In the exemplary embodiment shown in FIG. 9B, pads 906 on the bottom of the bottom lid 902 electrically connect to a printed circuit board (not shown). The pads 906 may be soldered to printed circuit board connections (not shown). The solder may be conductive. In other embodiments, the pads 906 may connect to the printed circuit board using tape, conductive paste, or other materials known to those skilled in the art. A conductive ring 908 around the perimeter of the bottom lid 902 forms a ground. The shape of the ground is exemplary only, and not limited to the conductive ring 908 shown. The number and arrangement of the pads 906 is also exemplary only, and not limited to what is shown. The pads 906 may be in a land grid array (LGA), or other pattern as required.

Figure 10A:
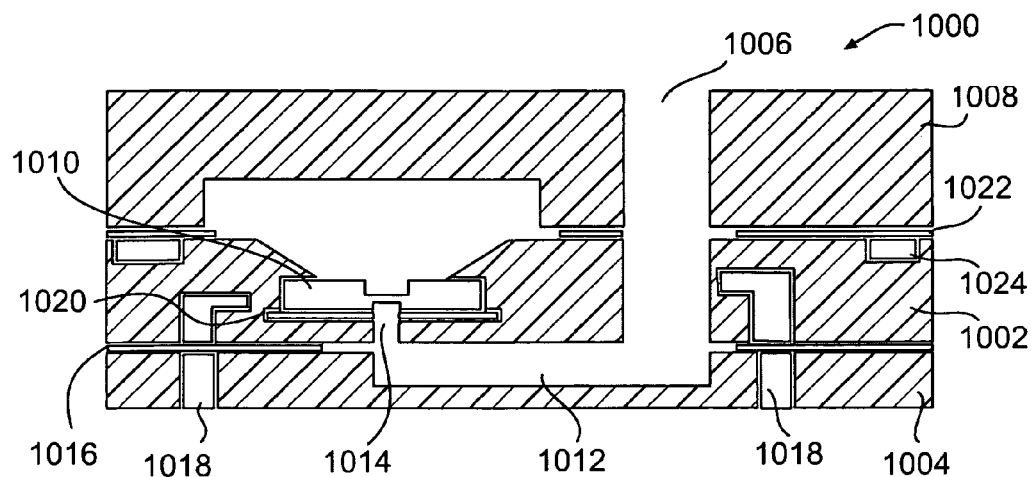
FIG. 10A illustrates an exemplary embodiment of a double-body MEMS package with a top acoustic port in accordance with the present invention.
Figure 10B:
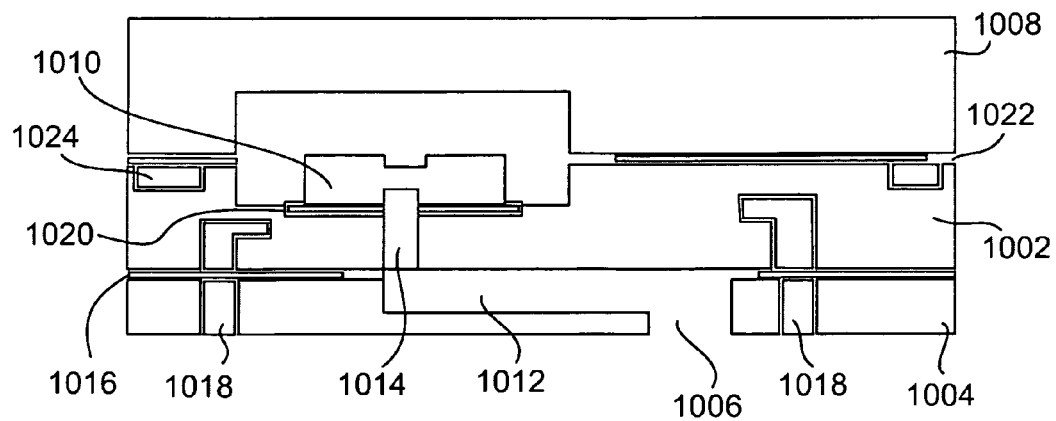
FIG. 10B illustrates an exemplary embodiment of a double-body MEMS package with a bottom acoustic port in accordance with the present invention.

FIGS. 10A and 10B show exemplary embodiments of double-body acoustic MEMS packages 1000/1050 with upper and lower molded bodies 1002/1004. The upper and lower molded bodies 1002/1004 may have one or more of a through-etched, partially-etched, or plated configuration. In the embodiment shown in FIGS. 10A and 10B, the upper molded body 1002 is at least partially integrally molded with a frame (not shown). The frame may be through or partially etched. In a double-body MEMS package, interconnections and the acoustic channel are formed by the upper and lower bodies 1002/1004. FIG. 10A shows an exemplary embodiment of a double-body MEMS package 1000 with a top acoustic port. In this exemplary embodiment, sound enters the MEMS package 1000 through a sound source acoustic port 1006 in the top of the lid 1008 and travels through the upper and lower molded bodies 1002/1004 until it reaches the MEMS die 1010. FIG. 10B shows an exemplary embodiment of a double-body MEMS package 1050 with a bottom port. In this exemplary embodiment, sound enters the MEMS package 1050 through a sound source acoustic port 1006 in the bottom of the lower molded body 1004 and travels through the lower and upper molded bodies 1004/1002 until it reaches the MEMS die 1010. The location of the sound source acoustic port 1006 is exemplary only, and not limited to what is shown. The location of the sound source acoustic port 1006 may be located elsewhere by repositioning inserts used to form the sound source acoustic port 1006 during molding of the upper and lower molded bodies 1002/1004. In the exemplary embodiments shown in FIGS. 10A and 10B, the sound source acoustic port 1006 connects to an acoustic channel 1012, which forms a sealed continuous path ending at a die site acoustic port 1014. After passing through the sound source acoustic port 1006, sound enters the acoustic channel 1012. The acoustic channel 1012 propagates sound to a membrane (not shown) at the die 1010. The acoustic channel 1012 may be formed by using one or more inserts (not shown) during the molding process, by drilling into the MEMS package, or by other methods known to those skilled in the art.

The lower molded body 1004 connects to the upper molded body 1002 and seals the acoustic channel 1012 to form the completed sound transmission route from the sound source acoustic port 1006 to the die site acoustic port 1014. In other embodiments, the acoustic channel 1012 may be sealed using solder, adhesive, plastic joining techniques, snapped in place using tabs with corresponding receivers (not shown), or by other methods known to those skilled in the art. In other embodiments the lower body may be machined instead of molded, or formed through a combination of molding and machining. Machining can be done mechanically, using a laser, or by other methods known to those skilled in the art. In still other embodiments, the lower molded body 1004 may be at least partially integrally molded with a frame (not shown), or printed circuit board (not shown). In the embodiment shown a lower adhesive layer 1016 connects the upper and lower bodies 1002/1004. In still further exemplary embodiments, the upper and lower molded bodies 1002/1004 may snap or glue together. In still further embodiments, solder may be used to connect the upper and lower molded bodies 1002/1004. The solder may be conductive. Conductive traces 1018 electrically connect the upper and lower molded bodies 1002/1004. In other embodiments conductive vias (not shown) or conductive posts (not shown) may electrically connect the upper and lower molded bodies 1002/1004.

In the exemplary embodiments shown in FIGS. 10A and 10B, the upper molded body 1002 functions as a carrier for the MEMS die 1010. The MEMS die 1010 is not limited to what is shown, and can be any die known to those skilled in the art. The MEMS die 1010 may be placed in the die cavity 1020 before molding the molded body to the frame (over-molding) or it may attach to the frame after molding the upper or lower body 1002/1004 with the frame (pre-molding). In an over-molded configuration, the die 1010 attaches to the frame (not shown) prior to molding the upper or lower molded body 1002/1004 to the frame. In a pre-mold configuration, the upper or lower molded body 1002/1004 is molded with the frame, and then the die attaches to the frame via exposed pads (not shown). The die may attach to the frame (not shown) in either a flip chip or a bonding wire configuration. In embodiments shown in FIGS. 10A and 10B the die 1010 attaches in a flip chip configuration. In a flip chip configuration, the die 1010 is inverted, so that the top of the die 1010 attaches to surface mount pads (not shown) on the conductive traces 1018. Attachment may be by gold bumping, soldering, conductive adhesive or epoxy, or other methods known to those skilled in the art. Attaching the die 1010 in a flip chip configuration eliminates the need to leave room in the lid for the bonding wires required in a bonding wire configuration, allowing for a substantial reduction in overall package height (thickness).

An upper adhesive layer 1022 connects the upper molded body 1002 to the lid 1008 and seals the MEMS package 1000/1050. The lid 1008 may be formed by molding or machining, and is not limited to what is shown. It may be formed using one or more of a liquid crystal polymer, mold compound, filled epoxy, filled nylon, or poly ether ketone (PEEK). The lid 1008 may also be plated plastic, or stamped metal. In certain embodiments, the lid 1008 may be conductive and form a Faraday Cage by connecting to a grounding connection, such as a grounding ring 1024. In the exemplary embodiment shown, the lid 1008 is comprised of molded liquid crystal polymer (LCP), which is glued to the MEMS package 1000/1050 and allowed to cure. Use of an adhesive layer is exemplary only, and not limited to what is shown. In other embodiments attachment can be by other ways known to those skilled in the art.

Although several embodiments of the present invention and its advantages have been described in detail, it will be apparent to those skilled in the art that various modifications and variations can be made in the apparatus and method of the present invention without departing from the spirit or scope of the invention. Thus, it is intended that the present invention cover the modifications and variations of this invention provided they come within the scope of the appended claims and their equivalents.

We claim:

1. A micro-electrical mechanical system (MEMS) package, comprising
  a molded body;
  a printed circuit board at least partially integral with the molded body;
  a leadframe connected to the molded body;
  a die cavity provided on the leadframe and having a first acoustic port;
  a MEMS die provided on the die cavity;
  a lid connected to the leadframe and having a second acoustic port, the lid sealing at least a portion of the die cavity, and the second acoustic port providing, and requiring the first acoustic port to provide, acoustic communication from an exterior of the MEMS package to the MEMS die; and
  a channel connecting the first and second acoustic ports, the lid sealing at least a portion of the channel.

2. A method of forming a micro-electrical mechanical system (MEMS) package, comprising the steps of:
  molding a substrate onto a printed circuit board such that at least a portion of the printed circuit board is integral with the substrate;
  connecting a leadframe to the molded substrate;
  providing a die cavity on the leadframe, the die cavity having a first acoustic port;
  providing a MEMS die on the die cavity;
  connecting a lid to the leadframe, the lid having a second acoustic port and sealing at least a portion of the die cavity, and the second acoustic port providing, and requiring the first acoustic port to provide, acoustic communication from an exterior of the MEMS package to the MEMS die; and
  forming a channel connecting the first and second acoustic ports, the lid sealing at least a portion of the channel.

3. A micro-electrical mechanical system (MEMS) package, comprising:
  a molded body;
  a first printed circuit board at least partially integral with the molded body;
  a second printed circuit board connected to the molded body;
  a die cavity provided on at least one of the first and second printed circuit boards and having a first acoustic port;
  a MEMS die provided on the die cavity;
  a lid connected to at least one of the first and second printed circuit boards and having a second acoustic port, the lid sealing at least a portion of the die cavity, and the second acoustic port providing, and requiring the first acoustic port to provide, acoustic communication from an exterior of the MEMS package to the MEMS die; and a channel connecting the first and second acoustic ports, the lid sealing at least a portion of the channel.

4. A method of forming a micro-electrical mechanical system (MEMS) package, comprising the steps of:
   molding a substrate onto a first printed circuit board such that at least a portion of the first printed circuit board is at least partially integral with the substrate;
   connecting a second printed circuit board to the substrate;
   providing a die cavity on at least one of the first and second printed circuit boards, the die cavity having a first acoustic port;
   providing a MEMS die on the die cavity;
   connecting a lid to at least one of the first and second printed circuit boards, the lid having a second acoustic port and sealing at least a portion of the die cavity, and the second acoustic port providing, and requiring the first acoustic port to provide, acoustic communication from an exterior of the MEMS package to the MEMS die; and
   forming a channel connecting the first and second acoustic ports, the lid sealing at least a portion of the channel.

5. A micro-electrical mechanical system (MEMS) package, comprising:
   a molded body having a first acoustic port;
   conductive traces applied to the molded body;
   a die cavity provided on the molded body and having a second acoustic port;
   a MEMS die provided on the die cavity, the second acoustic port providing, and requiring the first acoustic port to provide, acoustic communication from an exterior of the MEMS package to the MEMS die;
   a channel connecting the first and second acoustic ports;
   a first lid attached to the molded body and sealing at least a portion of the channel; and
   a second lid attached to the molded body and sealing at least a portion of the die cavity.

6. A method of forming a micro-electrical mechanical system (MEMS) package, comprising the steps of:
   forming a molded body having a first acoustic port;
   applying conductive traces to the molded body;
   providing a die cavity on the molded body, the die cavity having a second acoustic port;
   providing a MEMS die on the die cavity, the second acoustic port providing, and requiring the first acoustic port to provide, acoustic communication from an exterior of the MEMS package to the MEMS die;
   forming a channel connecting the first and second acoustic ports;
   attaching a first lid to the molded body, the first lid sealing at least a portion of the channel; and
   attaching a second lid to the molded body, the second lid sealing at least a portion of the die cavity.

7. A micro-electrical mechanical system (MEMS) package, comprising:
   a molded body having a first acoustic port;
   a leadframe at least partially integral with the molded body;
   a die cavity provided on the molded body and having a second acoustic port;
   a MEMS die provided on the die cavity, the second acoustic port providing, and requiring the first acoustic port to provide, acoustic communication from an exterior of the MEMS package to the MEMS die;
   a channel connecting the first and second acoustic ports;
   a first lid attached to the molded body and sealing at least a portion of the channel; and
   a second lid attached to the molded body and sealing at least a portion of the die cavity.

8. A method of forming a micro-electrical mechanical system (MEMS) package, comprising the steps of:
   molding a substrate having a first acoustic port to a leadframe such that the leadframe is at least partially integral with the substrate;
   providing a die cavity on the molded substrate, the die cavity having a second acoustic port;
   providing a MEMS die on the die cavity, the second acoustic port providing, and requiring the first acoustic port to provide, acoustic communication from an exterior of the MEMS package to the MEMS die;
   forming a channel connecting the first and second acoustic ports;
   attaching a first lid to the molded substrate such that the first lid seals at least a portion of the channel; and
   attaching a second lid to the molded substrate such that the second lid seals at least a portion of the die cavity.

9. A micro-electrical mechanical system (MEMS) package, comprising:
   a first molded body having a first acoustic port;
   a second molded body connected to the first molded body;
   a leadframe at least partially integral with at least one of the first and second molded bodies;
   a die cavity provided on at least one of the first and second molded bodies and having a second acoustic port;
   a MEMS die provided on the die cavity, the second acoustic port providing, and requiring the first acoustic port to provide, acoustic communication from an exterior of the MEMS package to the MEMS die;
   a channel connecting the first and second acoustic ports, the first molded body sealing at least a portion of the channel; and
   a lid attached to the second molded body and sealing at least a portion of the die cavity.

10. A method of forming a micro-electrical mechanical system (MEMS) package, comprising the steps of:
    forming a first substrate having a first acoustic port;
    forming a second substrate and connecting the second substrate to the first substrate;
    connecting a leadframe to one of the first and second substrates such that the lead frame is at least partially integral with at least one of the first and second substrates;
    providing a die cavity on at least one of the first and second substrates, the die cavity having a second acoustic port;
    providing a MEMS die on the die cavity, and the second acoustic port providing, and requiring the first acoustic port to provide, acoustic communication from an exterior of the MEMS package to the MEMS die;
    forming a channel connecting the first and second acoustic ports, the first substrate sealing at least a portion of the channel; and
    attaching a lid to the second substrate, the lid sealing at least a portion of the die cavity.

11. The method of forming a micro-electrical mechanical system as recited in claim 4, wherein the first and second printed circuit boards surround the molded body.

12. The micro-electrical mechanical system package as recited in claim 1, wherein the first and second acoustic ports are arranged such that a direction of entry into the ports is parallel to each other.

13. The micro-electrical mechanical system package as recited in claim 3, wherein the first and second acoustic ports are arranged such that a direction of entry into the ports is parallel to each other.

14. The micro-electrical mechanical system package as recited in claim 5, wherein the first and second acoustic ports are arranged such that a direction of entry into the ports is parallel to each other.

15. The micro-electrical mechanical system package as recited in claim 7, wherein the first and second acoustic ports are arranged such that a direction of entry into the ports is parallel to each other.

16. The micro-electrical mechanical system package as recited in claim 9, wherein the first and second acoustic ports are arranged such that a direction of entry into the ports is parallel to each other.

17. The micro-electrical mechanical system package as recited in claim 1, wherein the first acoustic port is underneath the MEMS die.

18. The micro-electrical mechanical system package as recited in claim 1, wherein the second acoustic port provides the acoustic communication downward into the MEMS package and the first acoustic port provides the acoustic communication upwards to the MEMS die.

19. The micro-electrical mechanical system package as recited in claim 5, wherein the second acoustic port provides the acoustic communication downward into the MEMS package and the first acoustic port provides the acoustic communication upwards to the MEMS die.

20. The micro-electrical mechanical system package as recited in claim 7, wherein the second acoustic port provides the acoustic communication downward into the MEMS package and the first acoustic port provides the acoustic communication upwards to the MEMS die.

\* \* \* \* \*

UNITED STATES PATENT AND TRADEMARK OFFICE
CERTIFICATE OF CORRECTION

PATENT NO. : 8,541,851 B2  Page 1 of 1
APPLICATION NO. : 12/678930
DATED : September 24, 2013
INVENTOR(S) : Ly et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 558 days.

Signed and Sealed this

Fifteenth Day of September, 2015

Michelle K. Lee
*Director of the United States Patent and Trademark Office*